(12) United States Patent
Ogawa

(10) Patent No.: US 7,719,857 B2
(45) Date of Patent: May 18, 2010

(54) STRUCTURE OF MOUNTING SHIELD COVER AND DISPLAY DEVICE

(75) Inventor: Yuji Ogawa, Kumamoto (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 11/928,401

(22) Filed: Oct. 30, 2007

(65) Prior Publication Data

US 2008/0180931 A1    Jul. 31, 2008

(30) Foreign Application Priority Data

Jan. 30, 2007    (JP) ............................. 2007-018992

(51) Int. Cl.
  *H05K 9/00*    (2006.01)
(52) U.S. Cl. ................. 361/816; 361/818; 361/800; 361/799; 361/753; 174/350; 174/351; 174/377
(58) Field of Classification Search ........... 361/753, 361/799, 800, 816, 818; 174/350, 351, 362, 174/377
See application file for complete search history.

(56) References Cited

U.S. PATENT DOCUMENTS

| 5,014,160 | A | * | 5/1991 | McCoy, Jr. ............. 361/818 |
| 5,436,802 | A | * | 7/1995 | Trahan et al. ............. 361/816 |
| 5,684,340 | A | * | 11/1997 | Soler et al. ............. 307/91 |
| 6,049,469 | A | * | 4/2000 | Hood et al. ............. 361/818 |
| 6,178,097 | B1 | * | 1/2001 | Hauk, Jr. ............. 361/816 |
| 6,390,891 | B1 | * | 5/2002 | Guha et al. ............. 451/41 |
| 6,608,251 | B1 | * | 8/2003 | Nurmi ............. 174/367 |
| 6,872,880 | B2 | * | 3/2005 | King et al. ............. 174/372 |
| 7,164,586 | B2 | * | 1/2007 | Lin ............. 361/714 |
| 7,277,301 | B2 | * | 10/2007 | Liang ............. 361/816 |
| 7,417,859 | B2 | * | 8/2008 | Bae et al. ............. 361/710 |

FOREIGN PATENT DOCUMENTS

| JP | 10-4284 | | 1/1998 |
| JP | 2000-286584 | | 10/2000 |
| JP | 2001-24375 | | 1/2001 |
| KR | 2005-0009365 | | 1/2005 |
| KR | 1020050009365 | * | 1/2005 |

* cited by examiner

*Primary Examiner*—Dameon E Levi
(74) *Attorney, Agent, or Firm*—Oblon, Spivak, McClelland, Maier & Neustadt, L.L.P.

(57) ABSTRACT

A structure of mounting a shield cover according to the present invention includes a shield cover having an insertion part which is inserted into a gap formed between a circuit substrate and a shield cover fastening part along the circuit substrate. The insertion part of the shield cover includes a convex part that is elastic and deformable, and the end of the insertion part and the shield cover fastening part come in contact with each other by the elasticity with the convex part being in contact with the circuit substrate as the fulcrum.

8 Claims, 6 Drawing Sheets

F I G . 1
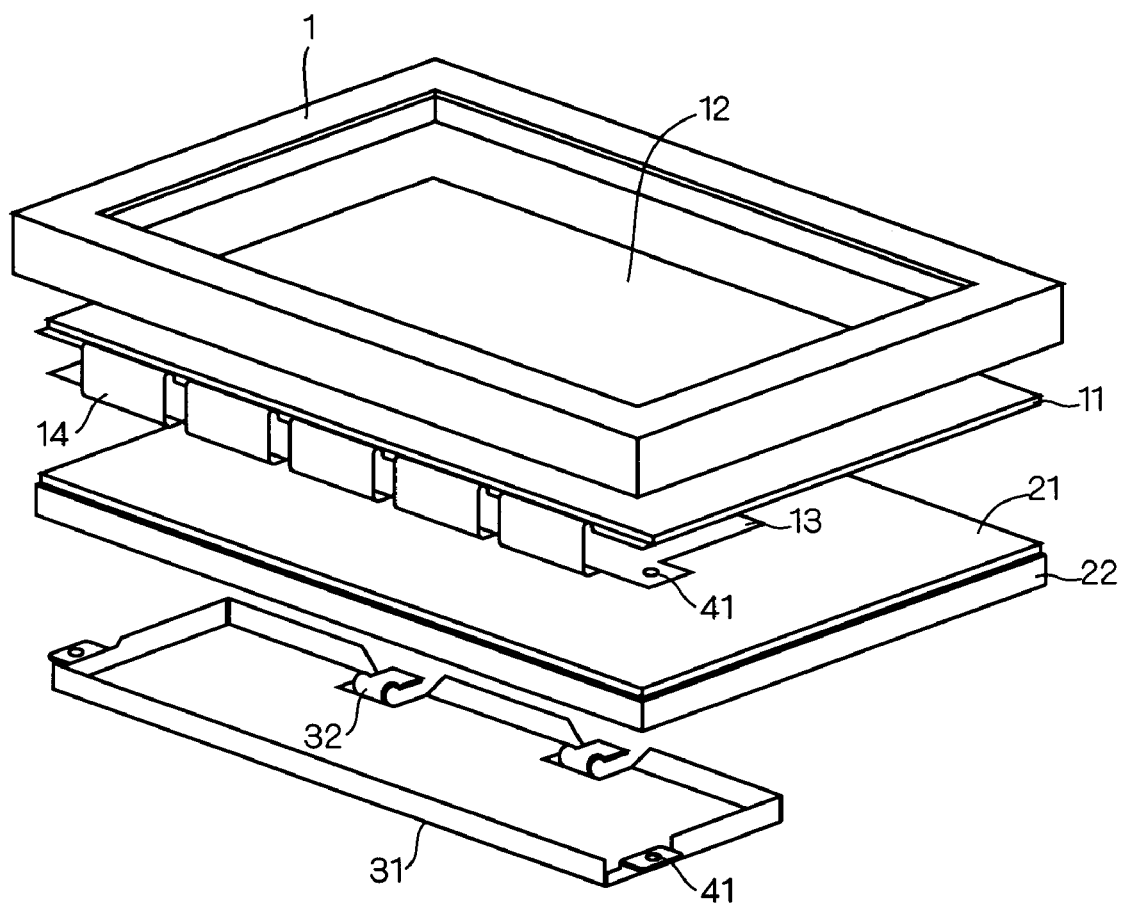

PRIOR ART

STRUCTURE OF MOUNTING SHIELD COVER AND DISPLAY DEVICE

BACKGROUND OF THE INVENTION

1. Field of the Invention

The present invention relates to structures of mounting shield covers and display devices, and more specifically to a structure of mounting a shield cover shielding electric and electronic components on a circuit substrate and a display device.

2. Description of the Background Art

Metal shield covers have been used to shield electric and electronic components on a circuit substrate. Conventional structures of mounting a shield cover typically use screws. While the shield cover is fastened and ground connection is established with reliability between the shield cover and the circuit substrate, the mounting with screws increases the number of screw components and results in poor assembly workability. To tackle these problems, a structure has been proposed to mount a shield cover by inserting an insertion part of the shield cover into a gap between the circuit substrate and a fastening part of the shield cover.

Japanese Patent Application Laid-Open No. 2000-286584 discloses a structure in which a shield cover is provided with a cushion contact piece that is used for pressure-contact, to establish reliable ground connection.

Unfortunately, the conventional mounting methods by inserting an insertion part of the shield cover into the gap cannot fasten the shield cover and establish ground connection between the shield cover and the circuit substrate with reliability. To solve this disadvantage, screws have to be used or conductive tape has to be affixed, which ends up increasing the number of components and results in poor assembly workability.

Moreover, JP 2000-286584 does not disclose a detailed method of mounting the shield cover, which cannot be fastened with reliability by a simple hook structure.

SUMMARY OF THE INVENTION

It is an object of the present invention to fasten a shield cover with reliability and establish ground connection between the shield cover and a circuit substrate with reliability.

In a first aspect of the invention, a structure of mounting a shield cover includes a shield cover including an insertion part inserted into a gap arranged between a first to-be-mounted body and a second to-be-mounted body along the first to-be-mounted body. The insertion part of the shield cover includes an elastic and deformable convex part, and the end of the insertion part and the second to-be-mounted body come in contact with each other by the elasticity with the convex part being in contact with the first to-be-mounted body as the fulcrum.

The shield cover can be fastened with reliability.

In a second aspect of the invention, a display device includes a structure of mounting a shield cover described below. The structure of mounting a shield cover includes a shield cover including an insertion part inserted into a gap arranged between a first to-be-mounted body and a second to-be-mounted body along the first to-be-mounted body. The insertion part of the shield cover includes an elastic and deformable convex part, and the end of the insertion part and the second to-be-mounted body come in contact with each other by the elasticity with the convex part being in contact with the first to-be-mounted body as the fulcrum. The first to-be-mounted body includes a circuit substrate, and the second to-be-mounted body includes a fastening part arranged via the gap with respect to the circuit substrate. The shield cover is made of metal, the circuit substrate includes a grand pattern on its surface, and the convex part of the shield cover comes in contact with the grand pattern of the circuit substrate. The display device includes the circuit substrate which is almost quadrangular in plane view, and the circuit substrate includes at least one aforementioned structure of mounting a shield cover on at least one side thereof.

The ground connection can be established with higher stability with a reduced number of screws.

These and other objects, features, aspects and advantages of the present invention will become more apparent from the following detailed description of the present invention when taken in conjunction with the accompanying drawings.

BRIEF DESCRIPTION OF THE DRAWINGS

FIGS. 1 and 2 are disassembled perspective views of a display device according to a preferred embodiment;

DESCRIPTION OF THE PREFERRED EMBODIMENT

Figure 2:
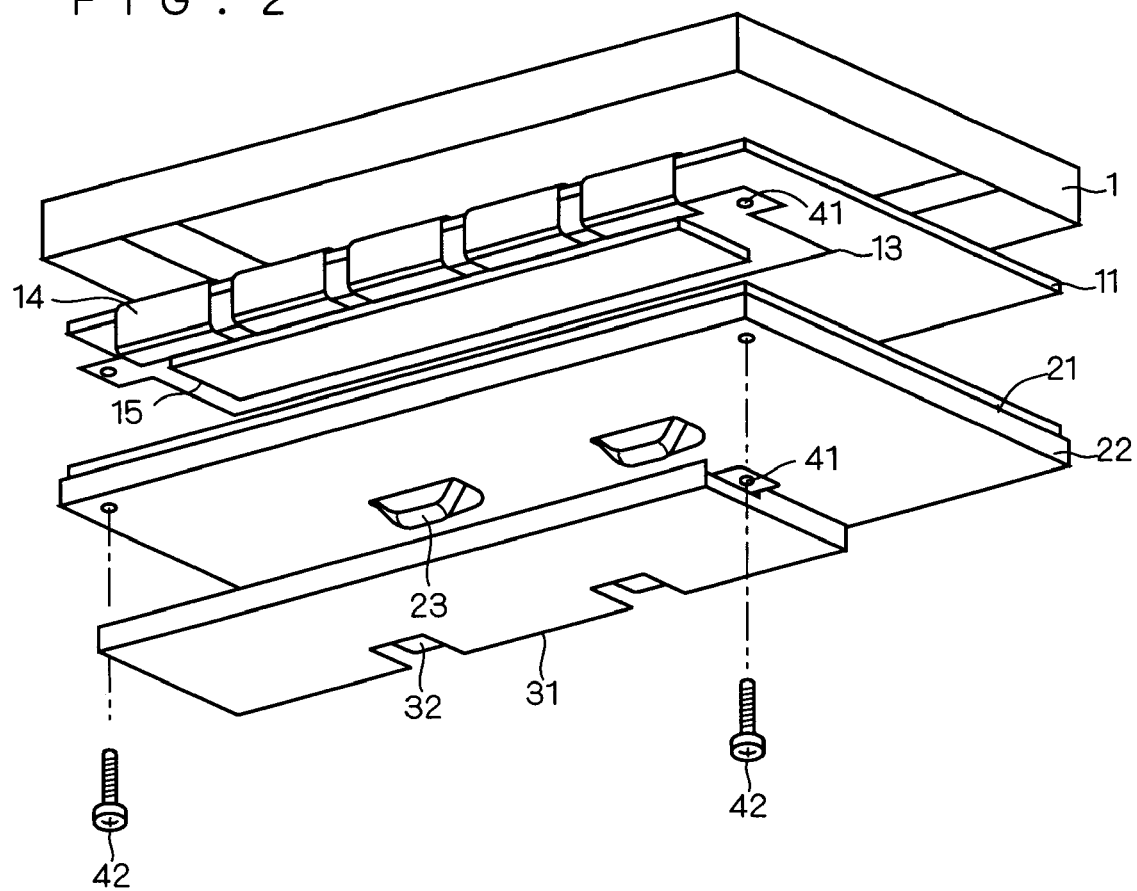

A display device including a structure of mounting a shield cover according to the present invention will be described in this embodiment. That display device may be a liquid crystal display device, for example. FIGS. 1 and 2 are disassembled perspective views of the display device according to this embodiment. FIG. 1 is a disassembled perspective view seen from the side of a display surface, and FIG. 2 from the side of a reverse surface to the display surface. This display device includes a front frame 1, a mounted panel 11, a backlight 21 and a shield cover 31.

The mounted panel 11 includes a display panel 12, a circuit substrate 13 and a member connecting these elements, e.g. a flexible printed circuit (FPC) 14. The display panel 12 may be a liquid crystal panel, for example. As depicted in FIG. 2, the display device according to this embodiment includes the circuit substrate 13 which is almost quadrangular in plane view. The mounted panel 11 has the backlight 21 interposed between the display panel 12 and the circuit substrate 13. The display panel 12 is arranged along the side of a light-emitting surface of the backlight 21.

The backlight 21 includes a rear frame 22 on the side of a reverse surface to the light-emitting surface. The aforementioned circuit substrate 13 is arranged along the side of the rear frame 22. The rear frame 22 is provided with, for when the circuit substrate 13 is arranged on a prescribed position of the rear frame 22, a shield cover fastening part 23 located on the circumference of the circuit substrate 13.

When the rear frame 22 is made of metal, an insulating resin film may be affixed on the surface of the rear frame 22, to arrange the circuit substrate 13 along that resin film.

The shield cover 31 is a metal cover that protects the circuit substrate 13 electrically and mechanically. When the shield cover 31 has a portion in contact with a circuit component 15, an insulating resin film may be affixed on that portion of contact. As depicted in FIG. 2, the circuit substrate 13, the rear frame 22 and the shield cover 31 are provided with screw fastening parts 41, respectively, which are located to coincide with one another.

Figure 3:
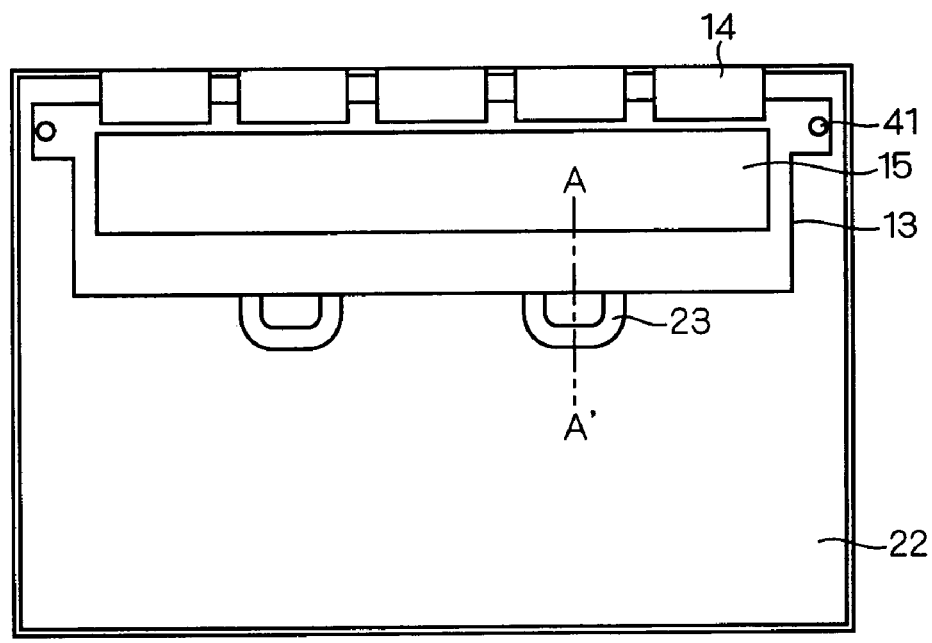
FIG. 3 is a frontal view for explaining the display device according to the preferred embodiment.
Figure 4:
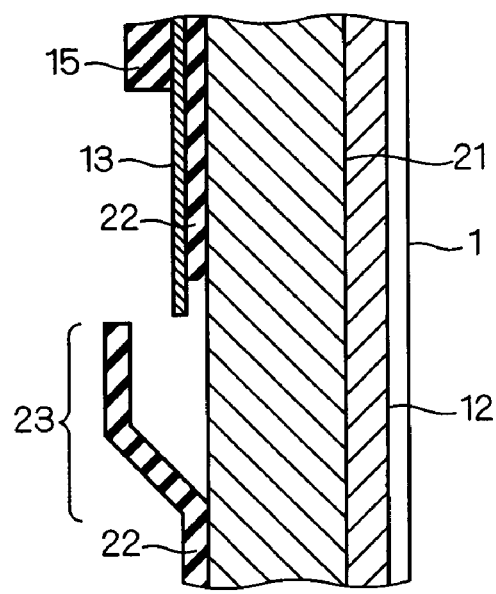
FIG. 4 is a cross-sectional view for explaining the display device according to the preferred embodiment.

FIGS. 3 and 4 show the display device assembled using the elements mentioned above except the shield cover 31. FIG. 3 is a frontal view of the display device seen from the side of the reverse surface, and FIG. 4 is a cross-sectional view taken along the line A-A' shown in FIG. 3. As depicted in FIG. 4, a gap is formed between the circuit substrate 13 and the shield cover fastening part 23 along the circuit substrate 13.

Figure 5:
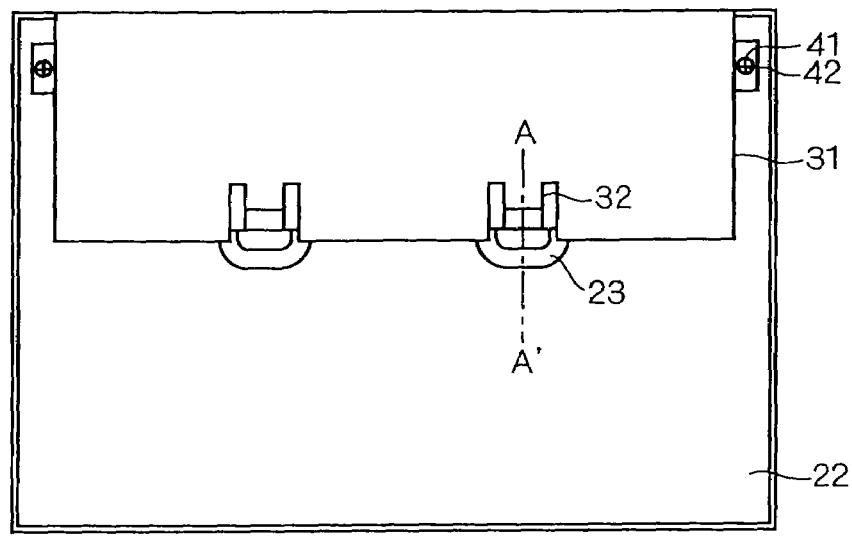
FIG. 5 is a frontal view for explaining a conventional display device.

The above description applies to conventional structures of mounting a shield cover. A conventional structure of mounting a shield cover of a display device is thus described. FIG. 5 is a frontal view of a display device on which the conventional shield cover 31 has been mounted, seen from the side of a reverse surface. The conventional shield cover 31 includes an insertion part 32 which is inserted into the gap formed between the circuit substrate 13 and the shield cover fastening part 23 along the circuit substrate 13. The insertion part 32 of the shield cover 31 is inserted into the aforementioned gap in FIG. 5. By screwing and fastening the screw fastening parts 41 together by screws 42, the circuit substrate 13, the rear frame 22 and the shield cover 31 are fastened.

Figure 6:
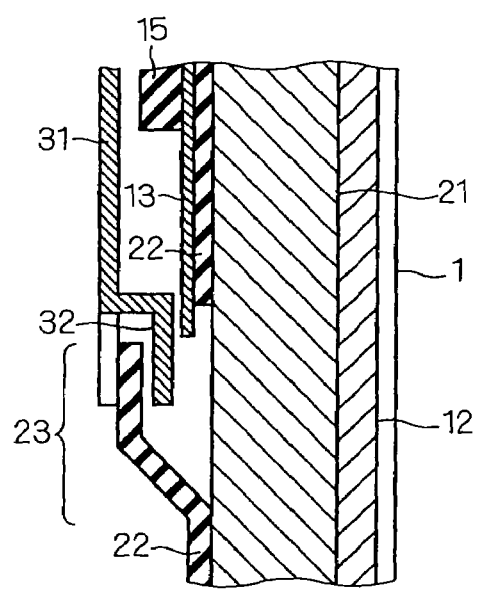
FIG. 6 is a cross-sectional view for explaining the conventional display device.

FIG. 6 is a cross-sectional view taken along the line A-A' shown in FIG. 5. The insertion part 32 of the conventional shield cover 31 has a bending shape as depicted in FIG. 6. With the conventional structure of mounting a shield cover of such shape, the insertion part 32 of the shield cover 31 forms a gap with at least one of the circuit substrate 13 and the shield cover fastening part 23, thus failing to make contact with both with stability. This prevents the shield cover 31 from being fastened with reliability, and also prevents ground connection from being established with reliability between the shield cover 31 and the circuit substrate 13.

Figure 7:
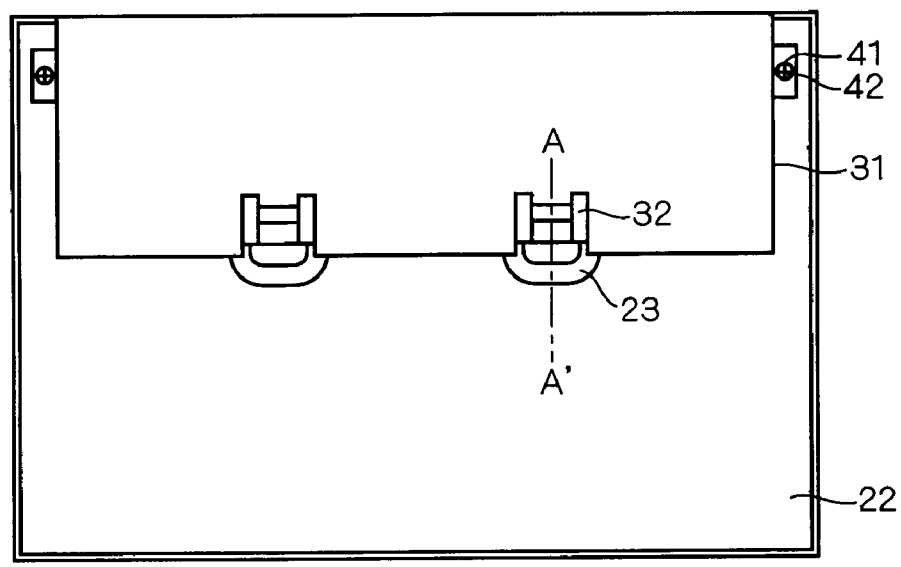
FIG. 7 is a frontal view for explaining a display device according to the preferred embodiment.

A structure of mounting a shield cover of a display device according to the first embodiment will now be described. FIG. 7 is a frontal view of a display device on which the shield cover 31 according to this embodiment has been mounted, seen from the side of a reverse surface. The shield cover 31 according to the first embodiment of the present invention includes a plurality of individual, spaced insertion parts 32 each of which is inserted into a corresponding gap formed between a first to-be-mounted body and a second to-be-mounted body along one edge of the first to-be-mounted body. In this embodiment, the first to-be-mounted body is the circuit substrate 13, and the second to-be-mounted body is the shield cover fastening part 23 arranged via the gap with respect to the circuit substrate 13.

The insertion part 32 of the shield cover 31 is inserted into the aforementioned gap in FIG. 7. And by screwing and fastening the screw fastening parts 41 together by the screws 42 just like the conventional structure of mounting a shield cover, the circuit substrate 13, the rear frame 22 and the shield cover 31 are fastened.

Figure 8:
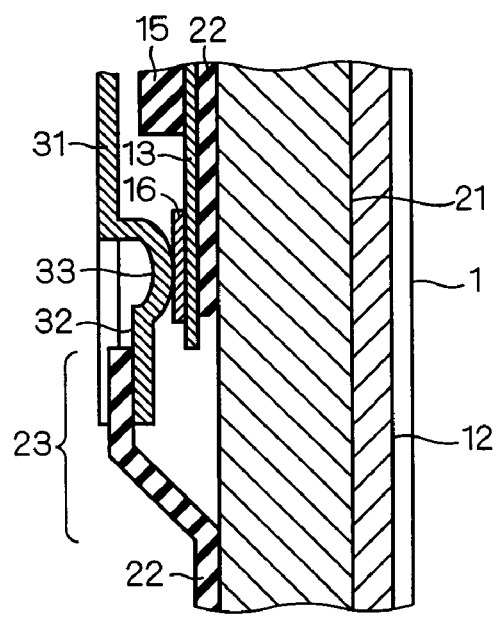
FIG. 8 is a cross-sectional view for explaining the display device according to the preferred embodiment.

FIG. 8 is a cross-sectional view taken along the line A-A' shown in FIG. 7. As shown, the insertion part 32 of the shield cover 31 includes a convex part 33 that is elastic and deformable. In this embodiment, the convex part 33 has a half-circle shape. This structure of mounting a shield cover brings the end of the insertion part 32 and the shield cover fastening part 23 in contact with each other by the elasticity with the convex part 33 being in contact with the circuit substrate 13 as the fulcrum.

As depicted in FIG. 8, the circuit substrate 13 also includes a ground pattern 16 on its surface. The convex part 33 of the shield cover 31 comes in contact with the ground pattern 16 of the circuit substrate 13.

The circuit substrate 13 includes at least one structure of mounting a shield cover described above on at least one side thereof. In the case of FIG. 7, the circuit substrate 13 includes two structures of mounting a shield cover described above on one side thereof. The circuit substrate 13, the rear frame 22 and the shield cover 31 are fastened by fastening the screw fastening parts 41 by the screws 42. Screwing and fastening the circuit substrate 13, the rear frame 22 and the shield cover 31 together in this manner reduces the number of the screws 42. While the screw fastening parts 41 are fastened by the screws 42 in this embodiment, other fastening methods may alternatively be used.

According to the display device of this embodiment having this structure, the end of the insertion part 32 of the shield cover 31 comes in contact with the shield cover fastening part 23 by the elasticity of the convex part 33. Thus, the insertion part 32 of the shield cover 31 does not form a gap with the circuit substrate 13 or with the shield cover fastening part 23, thereby fastening the shield cover 31 with reliability. In addition, since the distance between the shield cover 31 and the circuit component 15 can be kept constant by the dimensions of the shield cover 31, the circuit component 15 can be electrically and mechanically protected with reliability. Also, ground connection can be established with reliability between the shield cover 31 and the shield cover fastening part 23.

Although illustrated as having a half-circle shape in this embodiment, the convex part 33 may alternatively have a quadrangular shape for plane contact, or a sharp bending shape, or a partially embossing shape, or a shape for only the end to make contact.

Further, according to the display device of the first embodiment, the convex part 33 of the shield cover 31 comes in contact with the ground pattern 16 of the circuit substrate 13 by its own elasticity. This allows ground connection to be established with reliability between the shield cover 31 and the circuit substrate 13.

Moreover, the display device according to this embodiment includes two structures of mounting a shield cover described above on one side of the circuit substrate 13. The result is that the number of the screws 42 necessary to mount the shield cover 31 can be reduced, and the ground connection mentioned above can be established with higher reliability.

Figure 9:
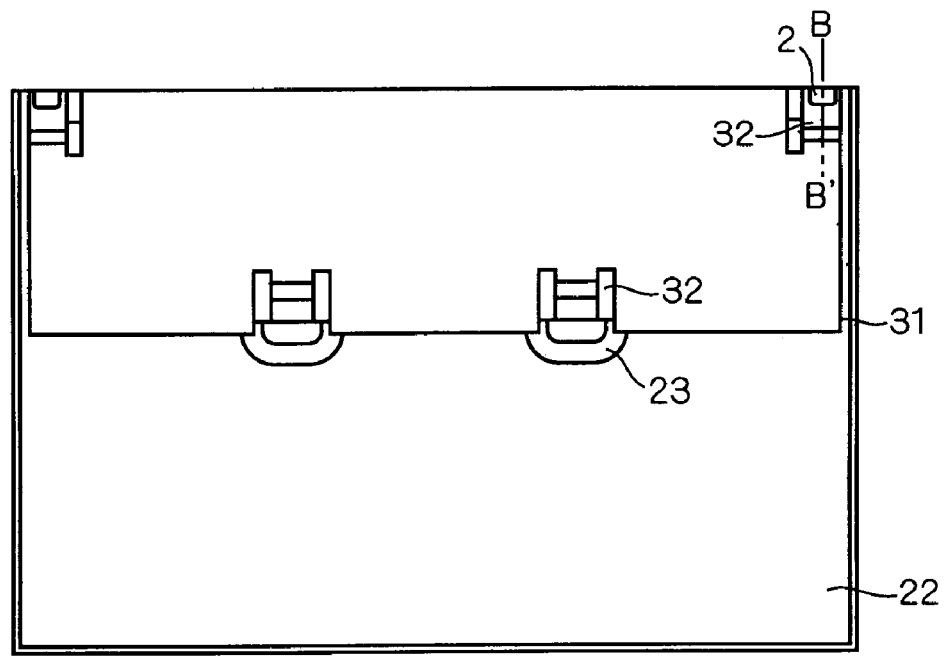
FIG. 9 is a frontal view for explaining a display device according to the preferred embodiment.
Figure 10:
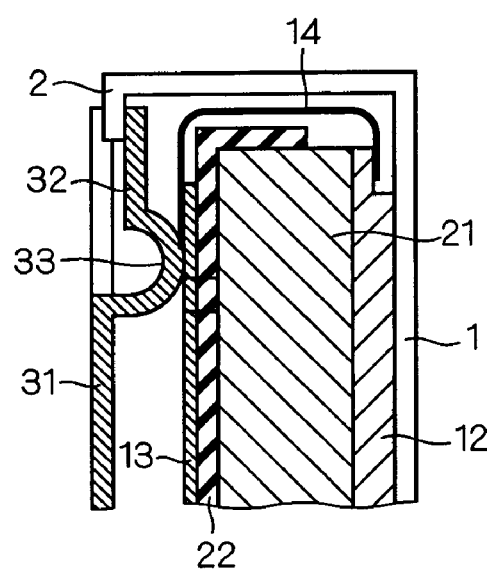
FIG. 10 is a cross-sectional view for explaining the display device according to the preferred embodiment.

The display device includes two structures of mounting a shield cover described above on one side of the circuit substrate 13 in the above description. Alternatively, as illustrated in FIG. 9, two structures of mounting a shield cover described above may be provided on two opposed sides of the circuit substrate 13, respectively. This further reduces the number of the screws 42 necessary to mount the shield cover 31, thus establishing the ground connection with higher reliability. Still alternatively, as illustrated in FIG. 10 which is a cross-sectional view taken along the line B-B' shown in FIG. 9, the shield cover fastening part 23 provided on the rear frame 22 may be provided on the front frame 1.

While the structure of mounting a shield cover has been described as being used in the display device according to this embodiment, the structure of mounting a shield cover according to this embodiment may be used to protect the circuit substrate 13 and the like in another device.

While the invention has been shown and described in detail, the foregoing description is in all aspects illustrative and not restrictive. It is therefore understood that numerous modifications and variations can be devised without departing from the scope of the invention.

What is claimed is:

1. A structure of mounting a shield cover, comprising:
a first to-be-mounted body,
a shield cover protecting said first to-be-mounted body, and
a member having a second to-be-mounted body provided along said first to-be-mounted body,
wherein
said shield cover includes an insertion part which is inserted into a gap arranged between said first to-be mounted body and said second to-be-mounted body, said insertion part including a section to be inserted, and an elastic and deformable convex part integrally formed to be continuous with the section to be inserted,
the convex part and said first to-be mounted body being in contact with each other, and said section to be inserted and the second to-be-mounted body being in contact with each other due to the elasticity of said convex part.

2. The structure of mounting a shield cover according to claim 1, wherein
said first to-be-mounted body is a circuit substrate, and
said second to-be-mounted body is a fastening part arranged via said gap with respect to said circuit substrate.

3. The structure of mounting a shield cover according to claim 2, wherein
said shield cover is made of metal,
said circuit substrate includes a ground pattern on a surface of the circuit substrate, and
said convex part of said shield cover comes in contact with said ground pattern of said circuit substrate.

4. A display device comprising a structure of mounting a shield cover, said structure comprising:
a first to-be-mounted body,
a shield cover protecting said first to-be-mounted body, and
a member having a second to-be-mounted body provided along said first to-be-mounted body,
wherein
said shield cover includes an insertion part which is inserted into a gap arranged between said first to-be mounted body and said second to-be-mounted body,
said insertion part including a section to be inserted, and an elastic and deformable convex part integrally formed to be continuous with the section to be inserted, the convex part and said first to-be mounted body being in contact with each other, and said section to be inserted and the second to-be-mounted body being in contact with each other due to the elasticity of said convex part,
said first to-be-mounted body is a circuit substrate,
said second to-be-mounted body is a fastening part arranged via said gap with respect to said circuit substrate,
said shield cover is made of metal,
said circuit substrate includes a ground pattern on a surface of the circuit substrate, and
said convex part of said shield cover comes in contact with said ground pattern of said circuit substrate, and
said display device comprising
said circuit substrate which is almost quadrangular in plan view, wherein
said circuit substrate includes at least one said structure of mounting a shield cover on at least one side thereof.

5. A display device, comprising:
a front frame;
a rear frame spaced from said front frame, said rear frame comprising a main body and a shield cover fastening part;
a circuit substrate in contact with a side of the main body of said rear frame facing away from said front frame, said circuit substrate having a ground pattern thereon;
a shield cover protecting said circuit substrate;
a display panel in contact with a side of said front frame facing said rear frame;
a backlight interposed between said display panel and said shield cover, said backlight having a light-emitting surface facing said display panel and a reverse surface facing away from said display panel; and
a flexible printed circuit connecting said display panel and said circuit substrate;
wherein,
said shield cover fastening part is provided along said circuit substrate,
said shield cover includes an insertion part which is inserted into a gap arranged between said shield cover fastening part and said circuit substrate, said insertion part including a section to be inserted, and an elastic and deformable convex part integrally formed to be continuous with the section to be inserted, the convex part and the ground pattern of said circuit substrate being in contact with each other, and said section to be inserted and said shield cover fastening part being in contact with each other due to the elasticity of said convex part.

6. The display device according to claim 5, wherein said shield cover is made of metal.

7. A display device, comprising:
a rear frame comprising a main body;
a front frame spaced from said rear frame, said front frame comprising a main body and a shield cover fastening part;
a circuit substrate in contact with a side of the main body of said rear frame facing away from said main body of said front frame, said circuit substrate having a ground pattern thereon;
a shield cover protecting said circuit substrate;
a display panel in contact with a side of said front frame facing said rear frame;
a backlight interposed between said display panel and said shield cover, said backlight having a light-emitting surface facing said display panel and a reverse surface facing away from said display panel; and
a flexible printed circuit connecting said display panel and said circuit substrate;
wherein,
said shield cover fastening part is provided along said circuit substrate,
said shield cover includes an insertion part which is inserted into a gap arranged between said shield cover fastening part and said circuit substrate, said insertion part including a section to be inserted, and an elastic and deformable convex part integrally formed to be continuous with the section to be inserted, the convex part and the ground pattern of said circuit substrate being in contact with each other, and said section to be inserted and said shield cover fastening part being in contact with each other due to the elasticity of said convex part.

8. The display device according to claim 7, wherein said shield cover is made of metal.

* * * * *